United States Patent [19]

Krishnamurthy et al.

[11] Patent Number: 5,638,140
[45] Date of Patent: Jun. 10, 1997

[54] FPLL HAVING AFC FILTER WITH LIMITED PHASE SHIFT

[75] Inventors: Gopalan Krishnamurthy, Wheeling; Victor G. Mycynek, Des Plaines; Gary J. Sgrignoli, Mt. Prospect, all of Ill.

[73] Assignee: Zenith Electronics Corporation, Glenview, Ill.

[21] Appl. No.: 345,886

[22] Filed: Jan. 27, 1995

Related U.S. Application Data

[62] Division of Ser. No. 175,333, Dec. 29, 1993, Pat. No. 5,410,368.

[51] Int. Cl.⁶ .......................... H04N 5/50; H04N 5/455
[52] U.S. Cl. .................. 348/735; 348/727; 331/34; 455/192.2; 375/326; 375/344; 375/374; 375/375

[58] Field of Search ........................ 348/735, 726, 348/638, 536, 512, 639, 641, 640, 645, 646, 647, 678, 679, 685, 727; 331/DIG. 2, 12, 25, 34; 455/192.2, 260, 234.1, 245.1; 375/81, 97, 120, 320, 317, 319, 326, 321, 344, 345, 362, 371, 375, 374, 376, 373; H04N 5/50, 5/455

[56] References Cited

U.S. PATENT DOCUMENTS

| 4,823,399 | 4/1989 | George | 348/735 |
| 4,945,415 | 7/1990 | McGinn | 348/735 |

*Primary Examiner*—John K. Peng
*Assistant Examiner*—John W. Miller

[57] ABSTRACT

An AFC filter for an FPLL comprises a filter formed of a network of resistors and capacitors exhibiting a predetermined phase response characteristic. The phase response characteristic is limited with increasing frequency to a value of about 90° during a start-up interval.

6 Claims, 6 Drawing Sheets

FPLL HAVING AFC FILTER WITH LIMITED PHASE SHIFT

This application is a division of application Ser. No. 08/175,333, filed Dec. 29, 1993, now U.S. Pat. No. 5,410,368.

CROSS REFERENCE TO RELATED APPLICATIONS

This application contains subject matter claimed in copending application Ser. No. 08/320,362, filed Oct. 10, 1994 entitled AGC SYSTEM WITH DIFFERENT GAIN REDUCTION RATES IN DIFFERENT MODES; and Ser. No. 08/174,867 filed Dec. 29, 1993, entitled POLARITY SELECTION CIRCUIT FOR BI-PHASE STABLE FPLL, all filed of even date herewith and all assigned to Zenith Electronics Corporation.

BACKGROUND OF THE INVENTION AND PRIOR ART

The present invention relates generally to digital data receivers and particularly concerns a digital television signal receiver.

A number of systems have recently been proposed for transmitting and receiving television signals in a digital form. The television signal may comprise, for example, a compressed wideband HDTV signal or one or more compressed NTSC signals. The two most widely promoted modulation techniques being considered for effecting such transmissions are quadrature amplitude modulation (QAM) and vestigial sideband modulation (VSB). U.S. Pat. No. 5,087,975 discloses a VSB system for transmitting a television signal in the form of successive M-level symbols over a standard 6 MHz television channel, with a relatively small (low level) pilot at the lower edge of the channel. While the number of levels M (i.e., the VSB mode) characterizing the symbols may vary, the symbol rate is preferably fixed, such as at a rate of 684 H (about 10.76 Megasymbols/sec.), where H is the NTSC horizontal scanning frequency. The number of symbol levels used in any particular situation is largely a function of the signal to noise (S/N) ratio characterizing the transmission medium, a smaller number of symbol levels being used in situations where the S/N ratio is low. It is believed that a system accommodating symbol levels of 24, 16, 8, 4 and 2 provides adequate flexibility to satisfy most conditions. It will be appreciated that lower values of M can provide improved S/N ratio performance at the expense of reduced transmission bit rate. For example, assuming a rate of 10.76 Megasymbols/sec., a 2-level VSB signal (1 bit per symbol) provides a transmission bit rate of 10.76 Megabits/sec., a 4-level VSB signal (2 bits per symbol) provides a transmission bit rate of 21.52 Megabits/sec., and so on.

Proper operation of a digital television receiver requires the received carrier signal to be acquired relatively rapidly and the gain of the RF and IF sections to be appropriately adjusted. Carrier acquisition in QAM receivers is relatively difficult because of the absence of any sort of pilot. While the use of a pilot in the above-mentioned VSB system greatly facilitates carrier acquisition, some difficulties may nevertheless be encountered due to the relatively low level of the pilot and the limited pull-in range of synchronous demodulators used in VSB receivers. One aspect of the invention enhances pull in of the FPLL and another deals with an improved AGC system. Also, the frequency and phase locked loop (FPLL) in the synchronous demodulator is bi-phase stable. Consequently, the phase of the output data may be inverted and therefore need to be phase reversed. Further, the lock-up characteristics of the FPLL are determined by the characteristics of the AFC filter and in another aspect of the invention, an improvement in such characteristics is provided. The invention also includes an arrangement for optimizing conversion of the analog signal to digital format when a DC offset is used to generate the pilot.

OBJECTS OF THE INVENTION

It is therefore a basic object of this invention to provide for improved carrier acquisition in a digital data receiver employing a synchronous demodulator.

It is a further object of the invention to provide a system for rapidly locking an FPLL used in association with the synchronous demodulator upon the occurrence of selected start-up conditions.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

As mentioned above, the transmitted VSB signal preferably includes a small pilot at the lower boundary of the 6 MHz television channel, which is converted to an intermediate frequency (IF) of about 46.69 MHz near the upper boundary of the channel. Also, although not limited thereto, the transmitted signal preferably comprises successive data frames each including 313 data segments. Each data segment includes 836 symbols (occurring at a rate of about 10.76 Megasymbols/sec.), 832 of which are used for data and 4 of which are provided in a fixed position of each data segment for defining a segment sync character. The data segment sync character comprises only 2-level symbols, while the data symbols may be 2, 4, 8, 16 or 24-level depending upon the application. Also, the first data segment of each frame comprises a sequence of 2-level symbols representing a frame synchronization code and a VSB mode control signal identifying the level M (24, 16, 8, 4 or 2) of the data symbols of the remaining 312 data segments of the frame.

The pilot may be conveniently developed in the transmitter by introducing an offset (constant DC level) to the symbol values. In the receiver the offset generates a constant DC which is used for carrier recovery. In accordance with one aspect of the invention, this "recovered" DC in the receiver is eliminated from the data channel, after carrier acquisition, to optimize further processing.

Figure 1:
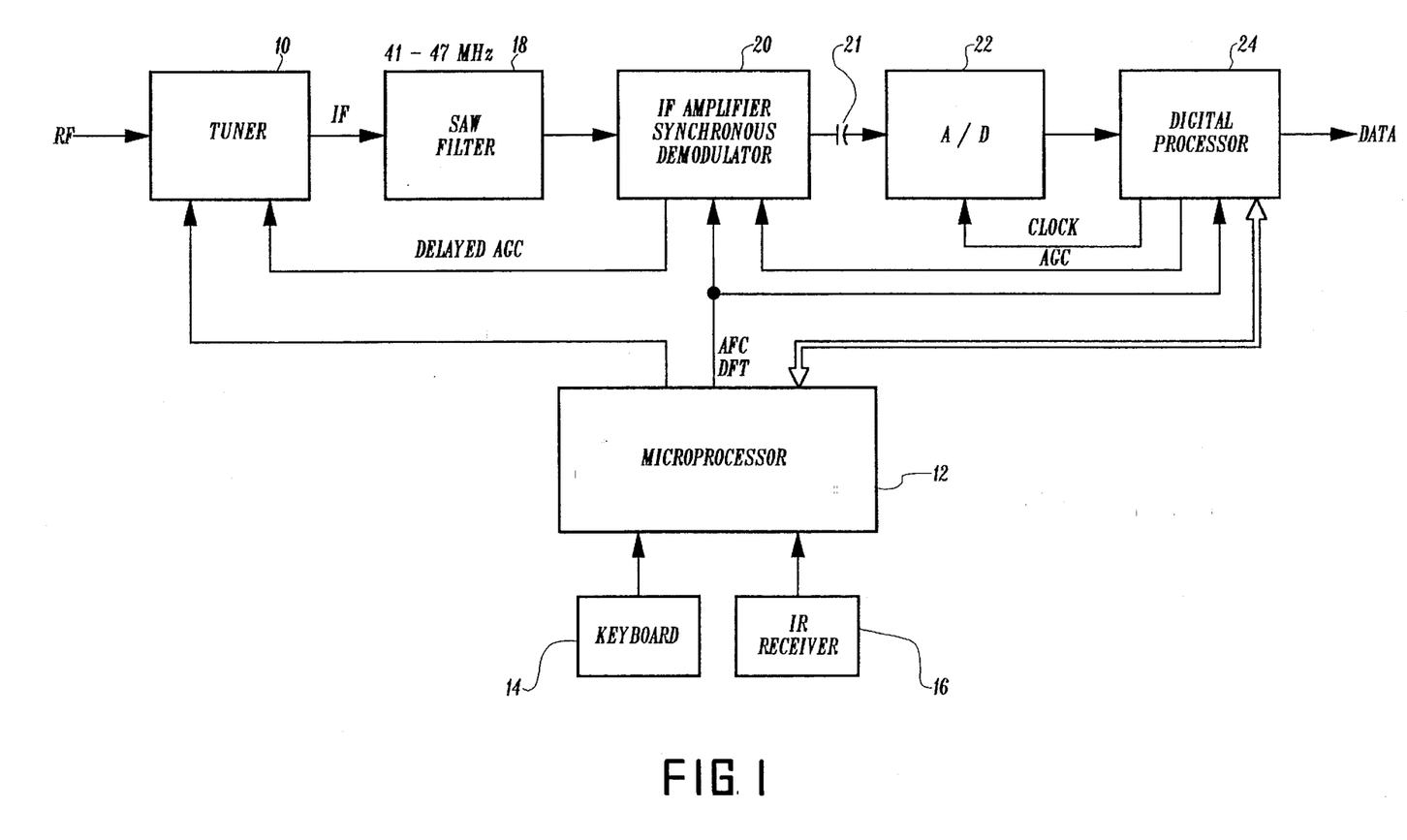
FIG. 1 is a partial block diagram of a receiver constructed for receiving an M-level VSB signal.

Referring to FIG. 1, the received RF signal is converted to an IF signal by a tuner 10, which is controlled by a microprocessor 12. Microprocessor 12 is responsive to user inputs, from either a keyboard 14 or an IR receiver 16, for applying appropriate signals to tuner 10 for tuning the selected channel. The IF signal, including the pilot at 46.69 MHz, is applied from tuner 10 through a SAW filter 18, having a pass-band of about 41–47 MHz, to an IF amplifier and synchronous demodulator 20. The analog baseband output of demodulator 20 is coupled via a capacitor 21 to an analog to digital (A/D) converter 22, which samples the signal and provides the M-level symbols in binary form to a digital processor 24. Capacitor 21 eliminates the DC offset mentioned above from the A/D 22 input. As will be explained in further detail hereinafter, A/D 22 is operated for sampling the output of demodulator 20 at the correct symbol times in response to a clock signal generated by digital processor 24. Digital processor 24 supplies the data and also supplies an AGC control signal to IF amplifier and synchronous demodulator 20 which, in turn, supplies a delayed AGC signal to tuner 10. Both demodulator 20 and digital processor 24 are responsive to an AFC Defeat signal generated by microprocessor 12 in response to selected start-up conditions, such as power-up, channel change and loss of data segment or frame synchronization. Finally, since the phase of the data output may be inverted because the FPLL in the synchronous demodulator is bi-phase stable, an automatic arrangement for providing the proper phase of data is also included. This is described more fully in connection with FIG. 5 and is claimed in copending application Ser. No. 08/174,867, filed Dec. 29, 1993 above.

Figure 2:
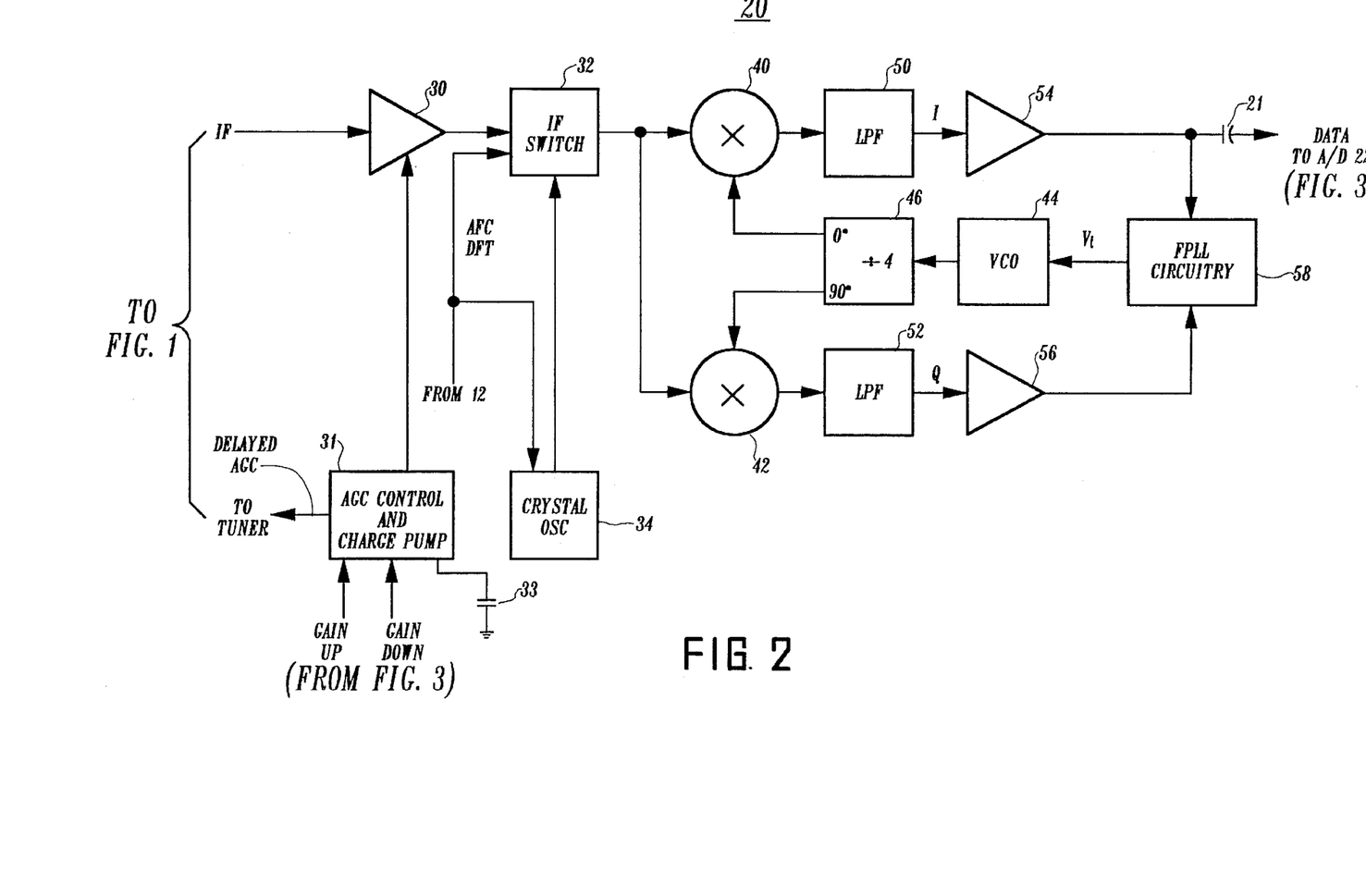
FIG. 2 is a more detailed showing of the IF amplifier and synchronous demodulator of FIG. 1.

IF amplifier and synchronous demodulator 20 is shown in more detail in FIG. 2. The IF signal from SAW filter 18 is applied through a gain controlled amplifier 30 to one input of an IF switch 32. The gain of amplifier 30 is controlled by an AGC control and charge pump 31. Circuit 31 is responsive to Gain-Up and Gain-Down signals for charging and discharging a capacitor 33 to a desired value for controlling the gain of amplifier 30. Circuit 31 also generates a delayed AGC signal for application to tuner 10.

A crystal oscillator 34 is enabled in response to the AFC Defeat signal from microprocessor 12 for applying a relatively strong signal at the frequency of the pilot (46.69 MHz) to a second input of IF switch 32. IF switch 32 is also responsive to the AFC Defeat signal for coupling the output of crystal oscillator 34 to the switch output and is otherwise operable for coupling the output of IF amplifier 30 to its output. Thus the output of IF switch 32 is the IF signal when the AFC Defeat signal is absent, and is the output of crystal oscillator 34 when the AFC Defeat signal is present.

Figure 6:
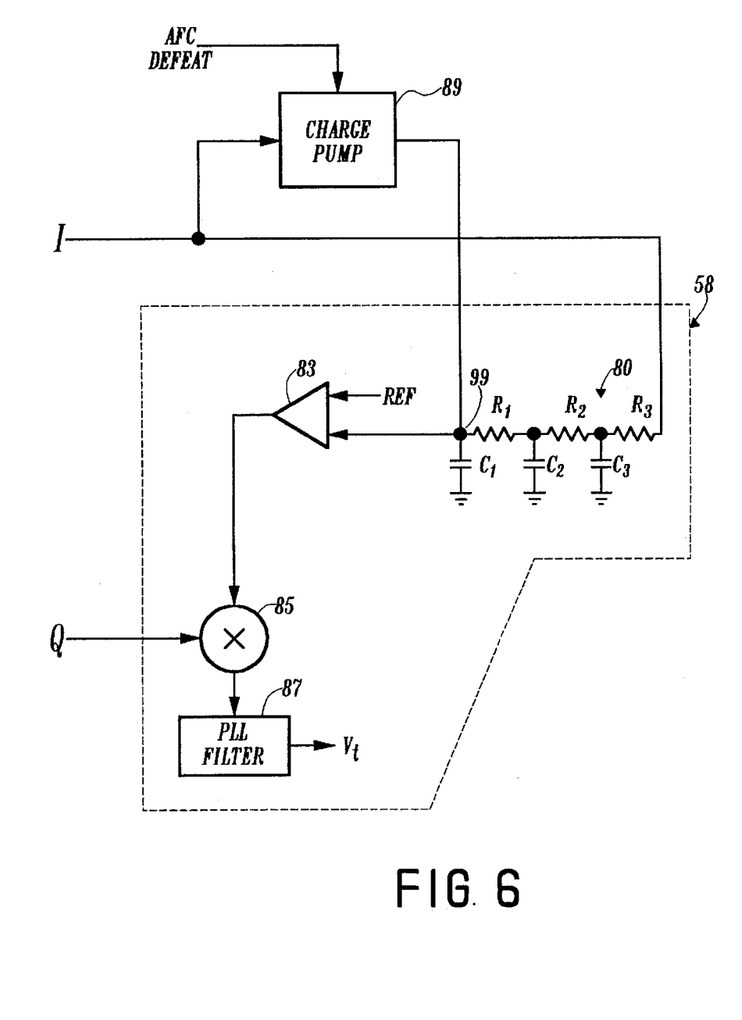
FIG. 6 is a modified PLL filter in accordance with the invention.

The output of IF switch 32 is applied to the first inputs of a pair of multipliers 40 and 42. A voltage controllable oscillator (VCO) 44 nominally generates an output at a frequency equal to 4×pilot frequency (i.e. 186.76 MHz), which is applied to a divide-by-four prescaler circuit 46 for producing a pair of 90° phase-displaced signals at the pilot frequency. The in-phase (0°) signal is applied to the second input of multiplier 40 to produce an in-phase baseband component I and the quadrature (90°) signal is applied to the second input of multiplier 42 to produce a quadrature baseband component Q. The I and Q components are coupled through respective low-pass filters 50 and 52 to remove second harmonic mixer products, and amplified by respective amplifiers 54 and 56 to provide desired output levels. The amplified I and Q components are supplied to respective inputs of FPLL circuitry 58, which includes an AFC filter, a limiter, a third multiplier and a PLL filter, all as shown in FIG. 6. FPLL circuitry 58 is operated, in a well known manner, for generating a tuning voltage $V_t$ for locking the frequency and phase of the signal generated by VCO 44 to 4 times the pilot frequency. Capacitor 21, as mentioned above, prevents the DC offset in the I channel signal from being applied to A/D 22. In this manner, the quadrature signals produced by divider 46 are locked to the pilot IF frequency for appropriately demodulating the received IF signal.

During certain start-up types of conditions, such as during power-up or a channel change, the frequency of VCO 44 may be so far from its nominal frequency of 186.76 MHz that rapid lock-up by synchronous demodulator 20 in response to the relatively small received pilot cannot occur. (Synchronous demodulator 20 typically has a pull-in range of only about ±100 KHz at the IF frequency with the weak pilot signal, whereas its pull-in range with a strong signal is typically about ±750 KHz.). To alleviate this problem, according to the invention the relatively strong 46.69 MHz output of crystal oscillator 34 is applied through IF switch 32 to the inputs of multipliers 40 and 42 during a start-up interval, which is defined by the AFC Defeat signal duration, rather than the received IF signal from IF amplifier 30. The start-up interval may be about 100 milliseconds (ms) long. Thus, during the start-up interval, a relatively strong signal at the frequency of the IF pilot is applied to the synchronous demodulator to rapidly bring the frequency of VCO 44 to its nominal value. After the start-up interval, as determined by the absence of the AFC Defeat signal, the IF signal from amplifier 30 is applied to the synchronous demodulator by IF switch 32. Since VCO 44 is now very near the nominal demodulation frequency, synchronous demodulator 20 may readily lock VCO 44 to the frequency and phase of the received pilot to facilitate proper demodulation.

The demodulated data is supplied from the I channel of synchronous demodulator 20, through capacitor 21, to the input of A/D 22 (FIG. 1). A/D 22 is responsive to a clock signal from digital processor 24 for sampling the analog I channel data signal at the correct sampling points and thereby providing a binary I channel data bit stream, representing the amplitudes of the received symbols, to the digital processor. The symbol values are preferably symmetrically disposed about a zero axis and the presence of any DC offset skews the values with respect to the zero axis. Therefore the A/D 22 needs to process amplitudes that are larger in one direction which requires a larger capacitor A/D. Elimination of the DC offset from the data channel by capacitor 21 permits the A/D 22 to see symmetrical inputs and consequently enables optimization of the size of A/D 22. The clock signal controlling sampling by A/D 22 is preferably generated as disclosed in copending application Ser. No. 07/894,388.

Figure 3:
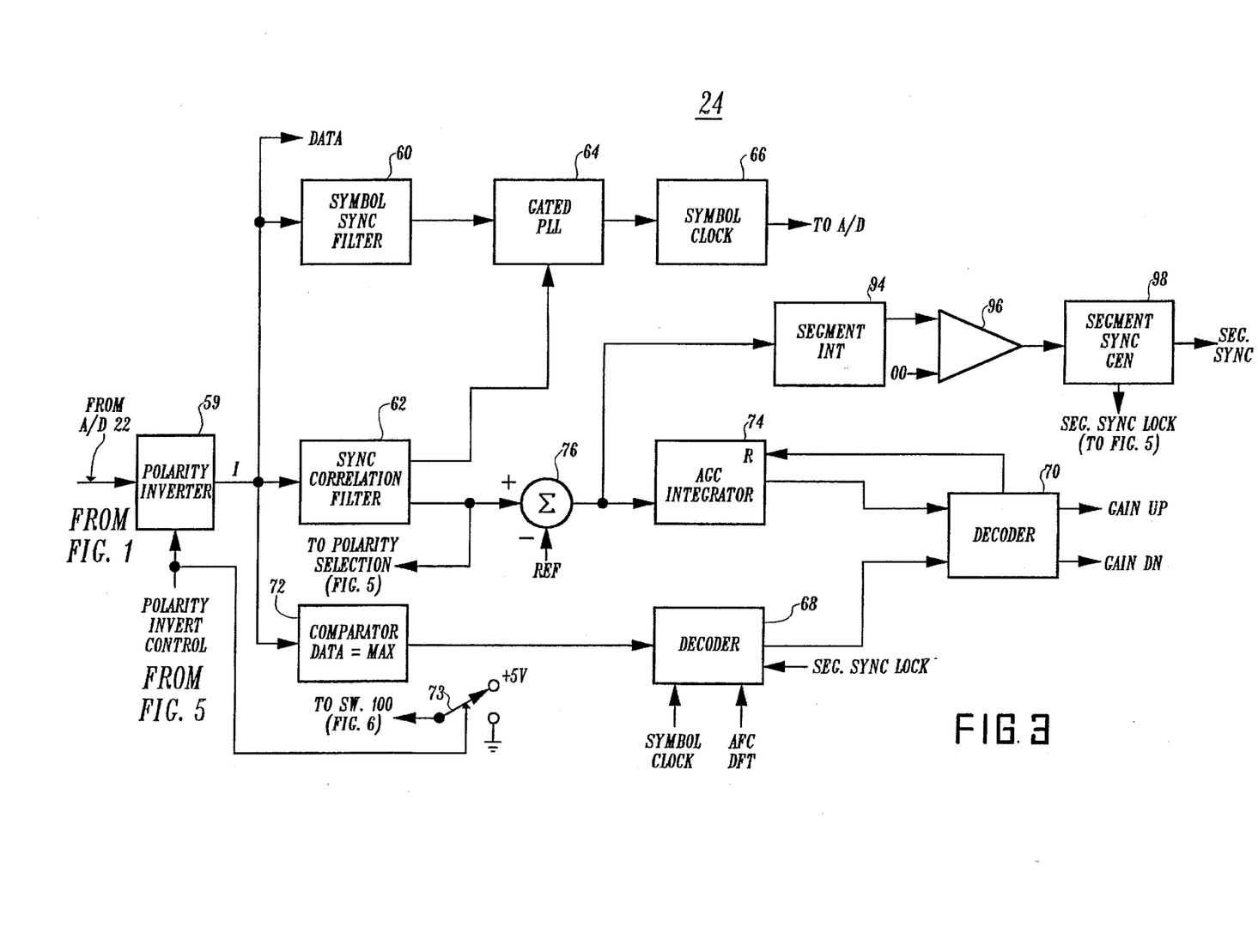
FIG. 3 is the circuit for controlling the AGC for the receiver.

As shown in FIG. 3, which represents the digital processor 24, the binary I channel data bit stream is applied to a polarity inverter 59 (controlled by a polarity invert control signal as will be described in FIG. 5) and thence to a symbol sync filter 60 and a sync correlation filter 62. Filter 60 is responsive to each segment sync character for producing a discriminator-type output having a zero-crossing at the center of the sync character. Filter 62 is configured for generating a relatively large pulse coinciding in time with the zero crossing of the output of filter 60. The output of filter 60 is gated into a PLL 64 by the pulse generated by filter 62. A symbol clock generator 66 is properly phased if the gated signal is zero. No corrections to the gated signal are effected by the PLL in this situation. However, if the gated signal is positive or negative, an appropriate error signal is generated by PLL 64 to correct the phase of the symbol clock until the gated signal achieves the desired zero value. As mentioned, the invention in this arrangement is claimed in Ser. No. 08/174,867, filed Dec. 29, 1993, above.

Figure 4:
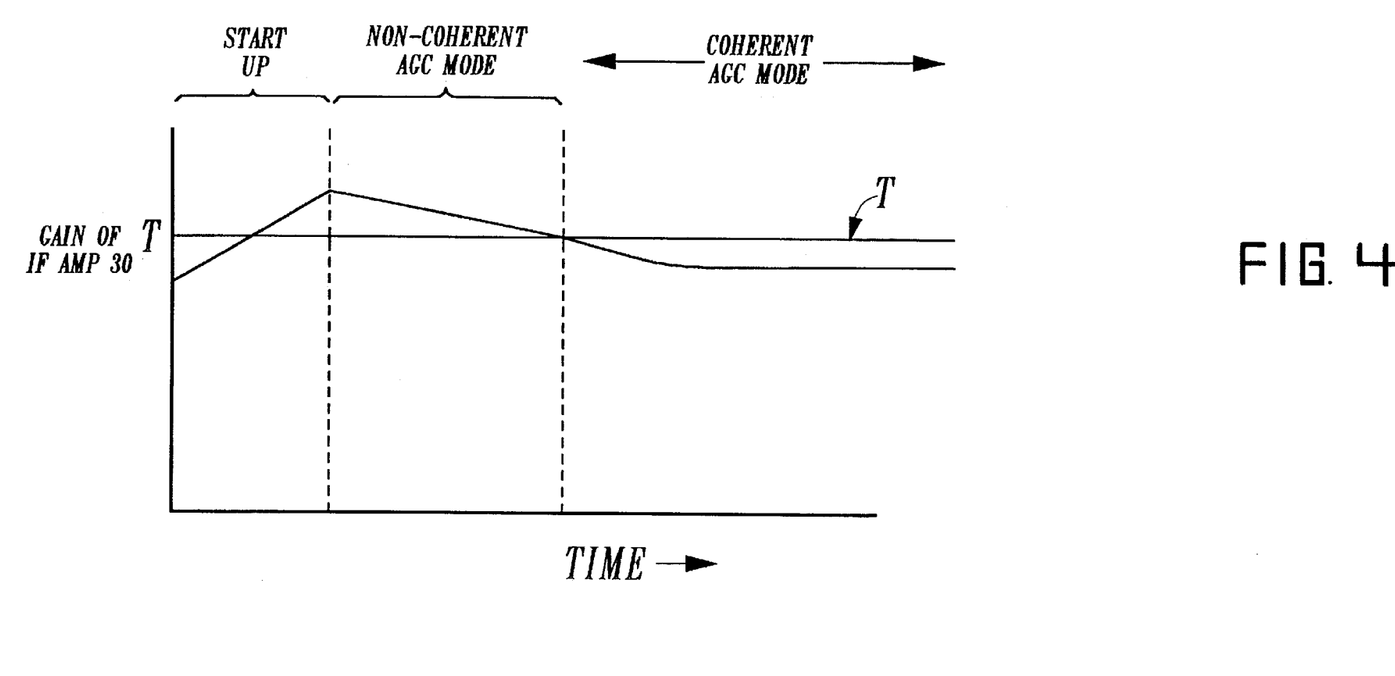
FIG. 4 depicts the operational modes of the AGC circuit.

In order to facilitate lock-up of synchronous demodulator 20, the receiver is operated in a noncoherent AGC mode for a short period after the start-up interval, and thereafter is operated in its normal, coherent AGC mode in another, much longer period corresponding to normal signal reception. These three periods are depicted in FIG. 4. In particular, during the start-up interval (i.e., the AFC Defeat signal is present), it is desired to adjust the gain of IF amplifier 30 to its maximum level. This insures that immediately after the start-up interval the gain of amplifier 30 will be at a maximum for facilitating lock-up by synchronous demodulator 20 to the relatively small received pilot in the IF signal. Thereafter, during the noncoherent AGC mode the gain of amplifier 30 is rapidly reduced until a threshold level T is reached, after which the AGC is operated in its coherent mode in which the amplifier gain is controlled relatively slowly.

More particularly (again referring to FIG. 3), a decoder 68 is responsive to the AFC Defeat signal for causing a second decoder 70 to generate a Gain-Up signal which is applied to charge pump 31 for rapidly increasing the gain of IF amplifier 30 independent of input signal strength. After the start-up interval (AFC Defeat signal absent), the binary I channel data signal which is being continually compared to a maximum value by a comparator 72 becomes effective. If the received data signal is equal to or exceeds the maximum value for eight consecutive symbols, decoder 68 generates an output causing decoder 70 to generate a Gain-Down signal for reducing the gain of amplifier 31 by a predetermined amount or step. This continues as long as the condition required by comparator 72 is satisfied. Once the condition is not satisfied, the receiver enters coherent AGC operation wherein the gain of amplifier 30 is controlled according to the strength of the received segment sync character, which is represented by the correlated pulse produced at the output of filter 62. The correlated pulse is applied to a polarity selection circuit in FIG. 5 to assure that the data polarity is correct since synchronous demodulator 20 can lock up in either of two phases. A reference level is subtracted from this correlated pulse in a summer 76 and the result is integrated in an AGC integrator 74, the output of which is applied to decoder 70 for controlling the gain of amplifier 31. In particular, when the integrated output of summer 76 exceeds a first level, a Gain-Down signal is generated by decoder 70 to reduce the gain of amplifier 31 and when the integrated signal falls below a second level a Gain-Up signal is generated by decoder 70 to increase the gain of amplifier 31. Integrator 74 is reset by decoder 70 after a Gain-Up or a Gain-Down signal is generated. The output of summer 76 is also applied to a segment sync integrator 94, the output of which is applied to one input of a comparator 96, the other input of which is supplied with a zero signal reference. The output of comparator 96 is supplied to a segment sync generator 98 for providing a segment sync output whenever the integrated correlation pulse from filter 62 is equal to or greater than a zero value.

It will thus be seen that the noncoherent AGC operation is relatively fast, being able to effect a gain change every eight symbol clocks. Coherent AGC operation, on the other hand, is responsive to the segment sync character and can thus effect a gain change only once per data segment. Also, in a preferred embodiment of the invention, non-coherent AGC operation has priority over coherent AGC operation. Thus, if the condition of comparator 72 is satisfied at any time (i.e. the I signal is equal to or greater than the maximum value for eight consecutive symbols), non-coherent mode AGC operation takes effect. The dual mode AGC operation is separately claimed in copending application D-6754, above.

As mentioned, synchronous demodulator 20 is bi-phase stable. Consequently, the phase of the output data may be inverted. The polarity inverter 59 in digital processor 24 inverts the phase of the data signal, if necessary. Polarity inverter 59 is controlled by a signal from the polarity selection circuit shown in FIG. 5.

Figure 5:
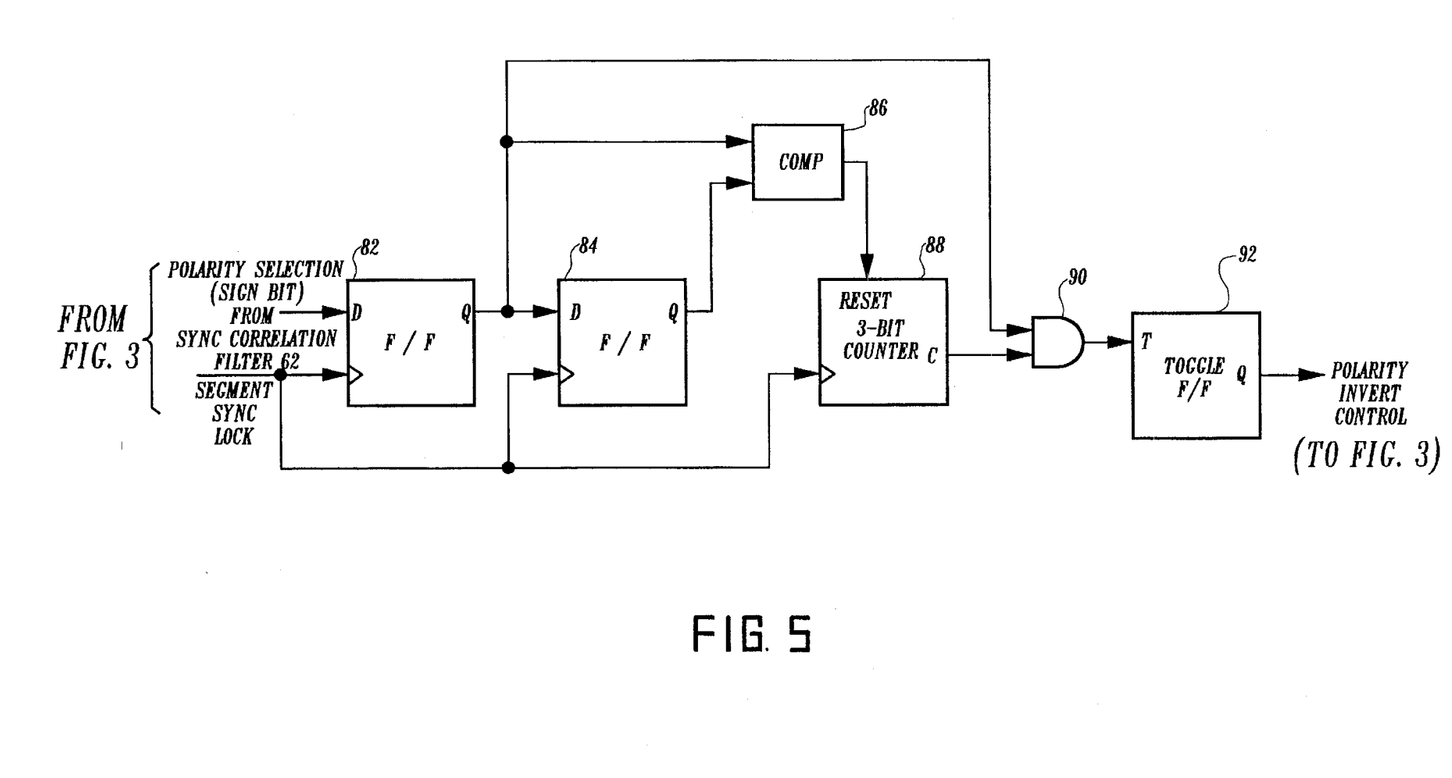
FIG. 5 discloses a data polarity inverter for automatically phase inverting the data, if required.

In FIG. 5, the sign bit of the correlated sync pattern produced at the output of filter 62 is coupled to the D input of a first flip-flop 82, whose Q output is coupled to the D input of a second flip-flop 84 and to one input of a comparator 86, whose second input is supplied with the Q output of flip-flop 84. The output of comparator 86 is applied to the Reset input of a 3-bit counter 88, whose Carry output is coupled to one input of an AND gate 90. A second input of AND gate 90 is supplied with the Q output of flip-flop 82 and the output of the gate is coupled to the toggle input of a toggle flip-flop 92. The Q output of flip-flop 92 comprises the polarity invert control signal which controls the operation of polarity inverter 59. Flip-flops 82–84 and counter 88 are clocked by the segment sync signal derived from segment sync generator 98 (FIG. 3).

The sign bit of the correlated output of filter 62 will be logic 0 when the output of synchronous demodulator 20 is properly phased. If the sign bit is logic 1, inverter 59 will be operated to invert the polarity of the data signal applied to digital processor 24.

More specifically, flip-flops 82 and 84 are operated for storing the sign bits of successive outputs of sync correlation filter 62. Logic 0 and logic 1 sign bits result in flip-flop states of Q=0 and Q=1, respectively. If the sign bit does not change (i.e. no output from comparator 86) for 8 successive segment sync characters, the output of counter 88 enables AND gate 90 for checking the polarity of the current sign bit. If it is not logic 0, i.e. the state of flip-flop 82 is Q=1, AND 90 will produce an output for toggling flip-flop 92, thereby causing polarity inverter 59 to change state. If the sign bit was logic 0, AND gate 90 does not produce an output and the state of inverter 59 is unchanged.

FIG. 6 shows a preferred embodiment of FPLL circuitry 58 (FIG. 2) which is also responsive to the AFC Defeat signal from microprocessor 12 as described hereinafter. The FPLL circuitry 58 conventionally includes an AFC filter 80 comprising a series of resistors R1, R2 and R3 and capacitors C1, C2 and C3. The input of filter 80 is connected for receiving the demodulated I channel data signal and its output is connected to one input of a limiter 83, the other input of limiter 83 being supplied with a reference voltage. The output of limiter 83 is supplied to one input of a multiplier 85. The demodulated Q signal is supplied to a second input of multiplier 85, whose output is connected to a PLL filter 87, which generates the voltage $V_f$ for controlling VCO 44 (FIG. 2).

Figure 7A:
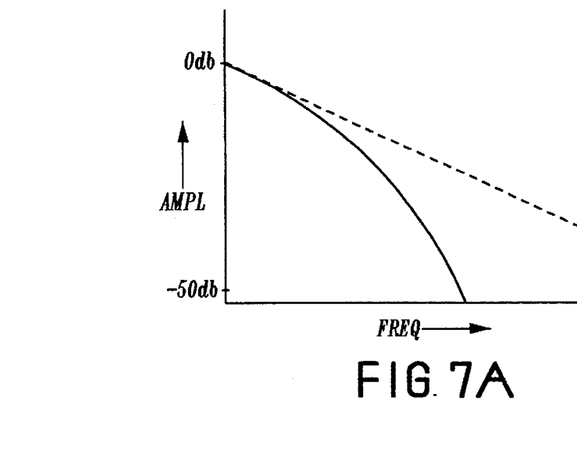
FIGS. 7A and 7B are curves illustrating operation of the FIG. 6 modification.
Figure 7B:
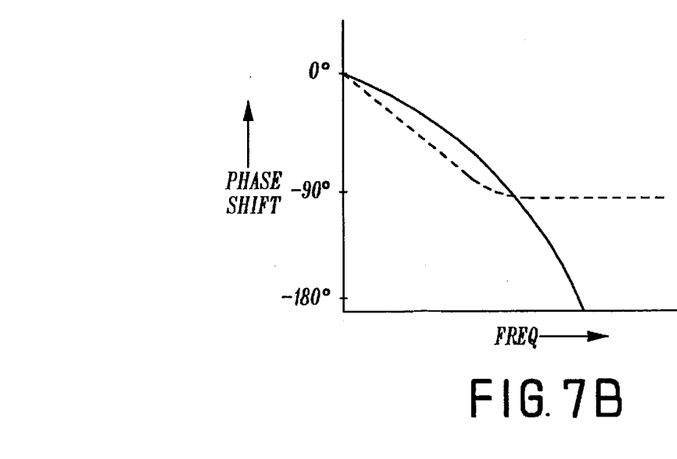

AFC filter 80 has amplitude and phase versus frequency response characteristics as shown in solid line in FIGS. 7A and 7B, respectively, for (1) rejecting the high frequency data components in the I channel data signal and (2) providing a phase shift of the input signal. An error in the frequency of VCO 44 from its nominal demodulating frequency is reflected in the production of beat frequencies in the I and Q signals. As long as the beat frequencies are not excessive, i.e., the frequency of VCO 44 is within a given range of the nominal demodulation frequency, AFC filter 80 will produce an output of sufficient amplitude and phase to allow for correction of the VCO frequency. Such correction is effected by multiplying the limited output of AFC filter 80 with the Q signal to supply a frequency correction signal to PLL filter 87. With reference to FIGS. 7A and 7B, it will be noted that as the beat frequency increases, the amplitude of the AFC filter response decreases and the phase shift imposed thereby approaches 180°. Both of these factors reduce the effectiveness of AFC filter 80 to make the necessary frequency correction. In particular, when the phase shift of the filter exceeds 180°, the frequency of VCO 44 is actually pushed in a direction opposite from that required to achieve frequency lock. During start-up conditions, the frequency of VCO 44 can be sufficiently different from its nominal frequency to result in this condition, making acquisition of the received signal very difficult, even when the synchronous demodulator is operated in response to the output of crystal oscillator 34.

The foregoing problems are overcome according to the present invention by providing a charge pump 89 which is enabled by the AFC Defeat signal for injecting a current into the output node 99 of AFC filter 80 in response to the I signal. This, in effect, modifies the amplitude and phase response characteristics as shown in dotted line in FIGS. 7A and 7B. It will be seen that the modified amplitude response provides a more gradual rolloff in the amplitude response of the filter with increasing frequency and in the phase shift. The phase shift, more importantly, is essentially fixed at about 90° for increasing frequencies and never gets to 180°. Thus, AFC filter 80 provides an increased level output signal having a phase shift of less than 180° (i.e., about 90°) to facilitate carrier acquisition in response to the output of crystal oscillator 34 during the start-up interval.

The invention concerning carrier acquisition of the signal with a synchronous demodulator is claimed below. It is recognized that changes may be made to the specific circuitry that are within the skill of the art and that the invention is to be limited only as defined in the claims.

What is claimed is:

1. In an FPLL of the type having an AFC filter, the improvement in carrier acquisition comprising control means operable for modifying the phase response of said AFC filter from a first response to a second response in which the phase shift characterizing said filter is limited to a value less than 180°.

2. The FPLL of claim 1 wherein said phase shift in said second response is limited to about 90°.

3. The FPLL of claim 2 wherein there is minimal fall off in filter signal amplitude during said second response.

4. An AFC filter for improving carrier acquisition in an FPLL comprising:

a filter circuit comprising a network of resistors and capacitors exhibiting a predetermined phase response characteristic; and means operable for modifying said predetermined phase response characteristic by limiting the phase shift of said network with increasing frequency to a value less than 180°.

5. The AFC filter of claim 4 wherein said phase shift is limited to about 90°.

6. The AFC filter of claim 5 wherein said operable means includes:

a charge pump coupled to said filter circuit;

means defining a start-up interval; and means operating said charge pump during said start-up interval for limiting said phase shift.

* * * * *